United States Patent [19]

Dishal et al.

[11] 4,161,696

[45] Jul. 17, 1979

[54] PULSE TRANSMITTER REFERENCE NETWORKS SUPPLYING ECD CAPABILITY

[75] Inventors: Milton Dishal, Clifton; James P. Van Etten, Nutley, both of N.J.

[73] Assignee: International Telephone and Telegraph Corporation, Nutley, N.J.

[21] Appl. No.: 879,326

[22] Filed: Feb. 21, 1978

Related U.S. Application Data

[63] Continuation-in-part of Ser. No. 767,427, Feb. 10, 1977, abandoned, which is a continuation-in-part of Ser. No. 634,308, Nov. 21, 1975, abandoned.

[51] Int. Cl.² .................... H04B 1/04; G01S 1/20; H03K 5/00; H03K 3/04
[52] U.S. Cl. ............................ 325/163; 343/103; 328/21; 328/65; 328/223
[58] Field of Search ............... 325/30, 105, 141, 163; 178/67; 343/103; 332/9 R, 16 R; 331/165, 166; 328/60, 113, 115, 116–117, 21, 65, 223

[56] References Cited

U.S. PATENT DOCUMENTS

| | | | |
|---|---|---|---|
| 3,325,810 | 6/1967 | Frank et al. | 343/103 |
| 3,774,210 | 11/1973 | Mollod et al. | 343/103 |
| 3,889,263 | 6/1975 | Johannessen | 343/103 |
| 3,955,144 | 5/1976 | Dishal | 325/159 |

Primary Examiner—Robert L. Griffin
Assistant Examiner—Aristotelis M. Psitos
Attorney, Agent, or Firm—John T. O'Halloran; Alfred C. Hill

[57] ABSTRACT

A method for varying the relationship of the RF cycles, produced by a reference network, inside a pulse envelope with respect to the start of the pulse envelope. The reference network, properly synthesized, is driven by a doublet impulse wherein the halves of the doublet may be varied both in width and in amplitude. In this manner, it is possible to phase shift the RF cycles by ±180° while not effecting movement of the pulse envelope.

10 Claims, 11 Drawing Figures

PULSE TRANSMITTER REFERENCE NETWORKS SUPPLYING ECD CAPABILITY

CROSS-REFERENCE TO RELATED APPLICATIONS

This is a continuation-in-part application of application Ser. No. 767,427 entitled "Pulse Transmitter Reference Networks Supplying ECD Capabilities" filed Feb. 10, 1977, now abandoned, which is a continuation-in-part application of application Ser. No. 634,308 entitled "Pulse Transmitter Reference Networks Supplying ECD Capability" filed Nov. 21, 1975, now abandoned.

BACKGROUND OF THE INVENTION

This invention relates generally to a method of producing envelope to RF cycle differences (ECD) in pulse transmitters, for example Loran, and more particularly to a method of varying the relationship of the RF cycles inside the resulting pulse envelope with reference to the envelope start.

The term "pulse envelope" as employed herein in the specification and claims is that pulse shape obtained by connecting the peaks of the RF cycles with an imaginary line.

In co-pending application, Ser. No. 515,788, filed Oct. 17, 1974 entitled "Feedback System for Pulse Transmitters", now U.S. Pat. No. 3,955,144, issued May 4, 1976 and assigned to the assignee of the present invention, it was shown that a correctly predistorted driving waveform could be obtained from certain unique outputs produced by a specially designed filter network driven by a simple impulse.

In many pulse systems, particularly Loran, the capability of being able to move the RF cycles of a waveform inside the envelope of the RF cycles without moving the envelope itself is required. In Loran, this relationship between the RF cycles of the waveform and the envelope of the RF cycles is called ECD; i.e. the envelope to cycle difference, and it is desired to be able to phase shift the RF cycles by 180° in either a positive or negative direction, while at the same time maintaining the envelope stationary.

SUMMARY OF THE INVENTION

It is an object of the present invention to provide a procedure for varying the envelope to cycle difference, while at the same time maintaining the envelope stationary.

According to a broad aspect of the invention, there is provided a method of varying the phase of RF cycles inside a pulse envelope while maintaining the pulse envelope stationary, the pulse envelope being the pulse shape obtained by connecting peaks of the RF cycles with an imaginary line the RF cycles being generated by a reference network which produces a pulse envelope of a predetermined shape comprising the steps of: impulsing the network with a doublet impulse, the doublet impulse comprising first and second adjacent pulses of opposite polarity; and varying the area under at least one of the first and second pulses to vary the phase relationship of the RF cycles within the envelope.

BRIEF DESCRIPTION OF THE DRAWINGS

Above-mentioned and other features and objects of this invention will become more apparent by reference to the following description taken in conjunction with the accompanying drawing, in which:

FIG. 2b is a waveform of the current i shown in FIG. 2a;

FIG. 3a is a schematic diagram of a band-pass network constructed from the circuit of FIG. 2a;

DESCRIPTION OF THE PREFERRED EMBODIMENT

The above referenced co-pending application describes a three-output reference network driven by a simple impulse generator, which reference network produces a desired predistorted driving waveform for a pulse transmitter. This, however, represents only one limiting case of a much more general driving function, i.e., the simple impulse driving function produces a single envelope to RF cycle relationship, whereas the inventive procedure results in any desired envelope to RF cycle relationship.

Figure 1A:
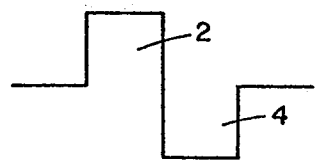
FIGS. 1a–1b are waveforms of a generalized doublet impulse driving function.
Figure 1B:
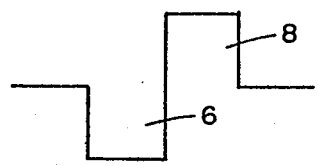

It has been determined that the desired full ECD performance can be obtained if the driving function employed takes the form shown in FIGS. 1a–1b. It may be seen that the driving function required consists of a generalized doublet impulse. The two impulse areas involved need not be equal; that is, both the amplitudes and the widths of the two impulses may vary depending upon the desired characteristics, as will be more fully described below. It should be noted at the outset, however, that for proper operation, the total time width of the generalized doublet impulse must be small compared to the time width of the RF half-cycle involved. So long as this requirement is satisfied, the two halves of the generalized doublet impulse need not have the same widths because the ECD produced is governed by the ratio of the positive to negative areas (height times width).

The relationship between the generalized doublet impulse amplitudes and the resulting RF cycle movement inside the pulse envelope is as follows: Referring to FIG. 1a, reducing the area (e.g. by reducing the amplitude) of impulse 2 causes the RF cycle to occur earlier in time, while reducing the area of impulse 4 causes the RF cycles to occur later in time. Likewise, referring to FIG. 1b, a reduction in amplitude of impulse 6 causes the RF cycle to occur earlier in time, and a reduction in amplitude of impulse 8 causes the RF cycle to occur later in time.

Figure 2A:
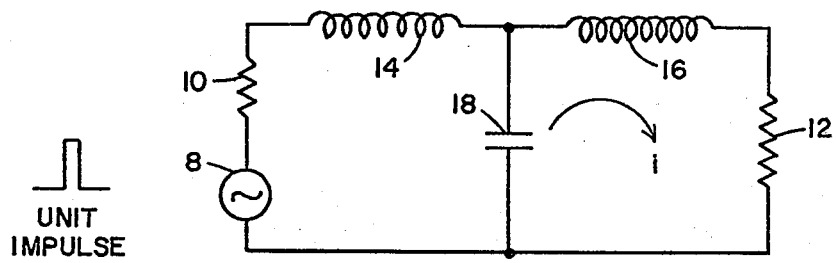
FIG. 2a is a schematic diagram of a low pass network which, when impulsed, produces a desired pulse shape.
Figure 2B:
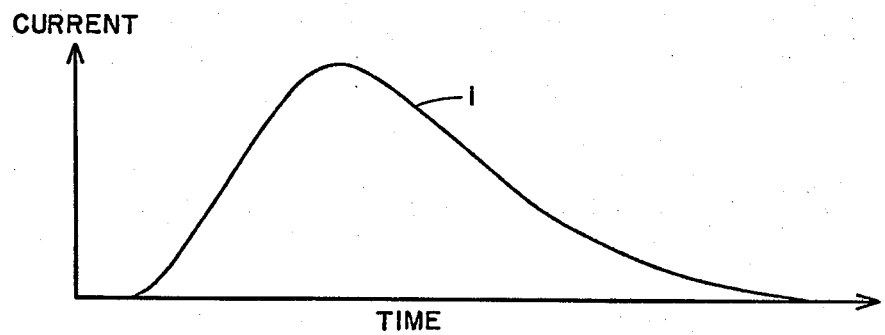

In order to illustrate the relationship between the doublet impulse and the resulting RF cycle phase for a zero phase shift reference network, it is necessary to synthesize an RF network which, when impulsed, will produce a pulse envelope of a desired shape. This may be done, for example, by first synthesizing a low-pass network which, when impulsed with a simple unit impulse, will produce a pulse shape which will later become the envelope produced by the RF cycles. This is shown in FIG. 2a, which comprises a simple unit impulse generator 8 and its associated resistance 10, a load 12, coils 14 and 16, and capacitor 18. When impulsed with a simple unit impulse, this circuit will produce a pulse shape of the type shown in FIG. 2b.

A band-pass network is then produced by adding a capacitor in series with each inductor in the low-pass network so as to series resonate the network to the desired carrier frequency. Also, an inductor is added in parallel with each capacitor in the low-pass network so as to parallel resonate the network to a desired carrier frequency. The circuit now appears as it does in FIG. 3a. Like elements have been denoted with like reference numerals. As can be seen from FIG. 3a, capacitor 20 has been added in series to inductor 14, capacitor 22 has been added in series with inductor 16, and inductor 24 has been added in parallel with capacitor 18. When this circuit is impulsed with a simple unit impulse, the waveform shown in FIG. 3b is produced wherein the RF cycles have a fixed phase relationship to the pulse envelope which is the pulse shape obtained by connecting the peaks of the RF cycles with an imaginary line as indicated by dotted lines E and E'. It has been discovered, however, that when the circuit is impulsed with the above described generalized doublet impulse, the phase of the RF cycles with respect to the pulse envelope may be varied while maintaining the pulse envelope stationary.

Figure 3A:
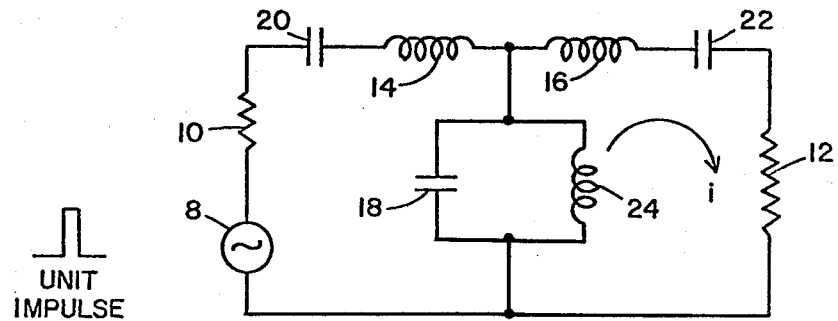
Figure 3B:
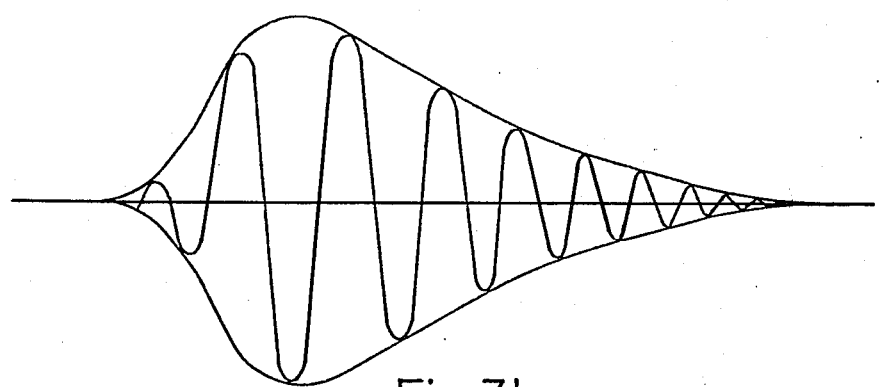
FIG. 3b is a waveform of the current i produced when the circuit of FIG. 3a is impulsed.
Figure 4:
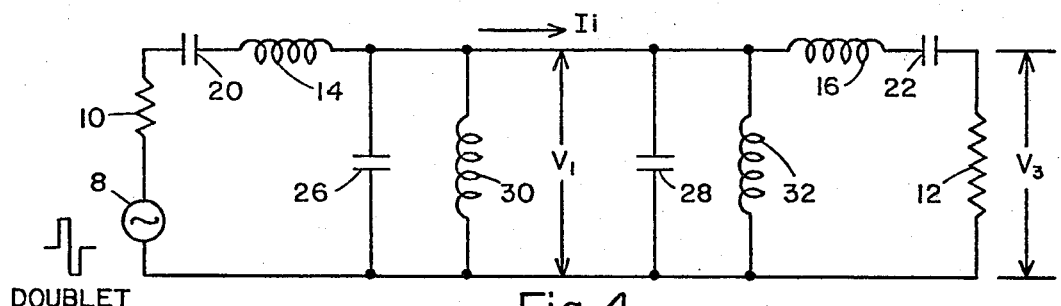
FIG. 4 is a schematic diagram of the circuit of FIG. 3a having its middle parallel circuit partitioned.

In the above referenced copending application, the middle parallel resonate circuit comprising capacitor 18 and inductor 24 in FIG. 3a is partitioned as shown in FIG. 4. Capacitor 18 and inductor 24 of FIG. 3a have now become capacitors 26 and 28 and inductors 30 and 32 shown in FIG. 4. The current waveshape $I_1$ and the voltage waveshape $V_1$ are sampled and correctly combined to drive a transmitter. The output voltage $V_3$ is used as the reference voltage for the feedback circuitry of the transmitter as described in the above referenced copending application.

Figures 5, 7:
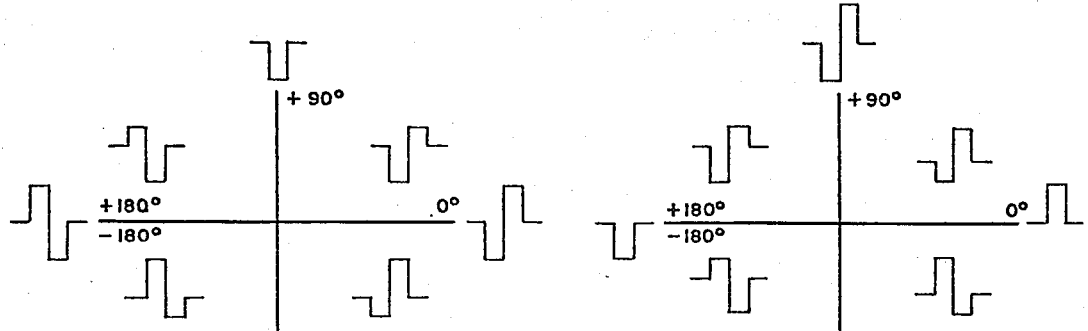
FIG. 5 illustrates graphically the movement of the RF cycles inside the stationary envelope when a zero phase shift at fo (center frequency) 3 pole reference network is driven by the changing generalized doublet impulse.
FIG. 7 illustrates in graphical form the phase change characteristics of the circuit shown in FIG. 6, or in general any 90° phase shift at fo, 3 pole reference network, when it is driven by the changing generalized doublet impulse.

The relationship governing the movement of the RF cycles inside the stationary pulse envelope with a zero phase shift at fo, 3 pole reference network, is shown in Table 1 and FIG. 5. As may be seen, beginning at 0° RF phase change (the reference point), the amplitudes of the first and second impulses are −4.0 and +4.0, respectively. As the amplitude of the first impulse is reduced in negative value, while that of the second impulse is maintained at a constant positive value, the RF phase change approaches −90°. Minus 180° is then approached when the amplitude of the first impulse is held at a constant positive value while the amplitude of the second impulse increases in negative value. As the amplitude of the first impulse is maintained at a negative constant value and that of the second impulse is a reducing positive value, +90° is approached. When the amplitude of the second impulse is maintained at a negative constant value while that of the first impulse is an increasing positive value, the RF phase change approaches +180°.

TABLE I

| RF Phase Change (Degrees) | Change in μS When RF Cycles Occur at a 100 KHz RATE | First Pulse (Volts) | Second Pulse (Volts) | |
|---|---|---|---|---|
| +180 | +5 | +4.0 | −4.0 | |
| +144 | +4 | +3.8 | −4.0 | |
| +126 | +3.5 | +3.6 | −4.0 | |
| +108 | +3 | +3.0 | −4.0 | |
| +90 | +2.5 | 0 | −4.0 | |
| +90 | +2.5 | −4.0 | 0 | |
| +72 | +2 | −4.0 | +3.0 | |
| +72 | +2 | −4.0 | +3.0 | |
| +54 | +1.5 | −4.0 | +3.6 | |
| +36 | +1 | −4.0 | +3.8 | |
| 0 | 0 | −4.0 | +4.0 | ←Reference Point |
| −36 | −1 | −3.8 | +4.0 | |
| −54 | −1.5 | −3.6 | +4.0 | |
| −72 | −2 | −3.0 | +4.0 | |
| −90 | −2.5 | 0 | +4.0 | |
| −90 | −2.5 | +4.0 | 0 | |
| −108 | −3 | +4.0 | −3.0 | |
| −126 | −3.5 | +4.0 | −3.6 | |
| −144 | −4 | +4.0 | −3.8 | |
| −180 | −5 | +4.0 | −4.0 | |

Figure 6:
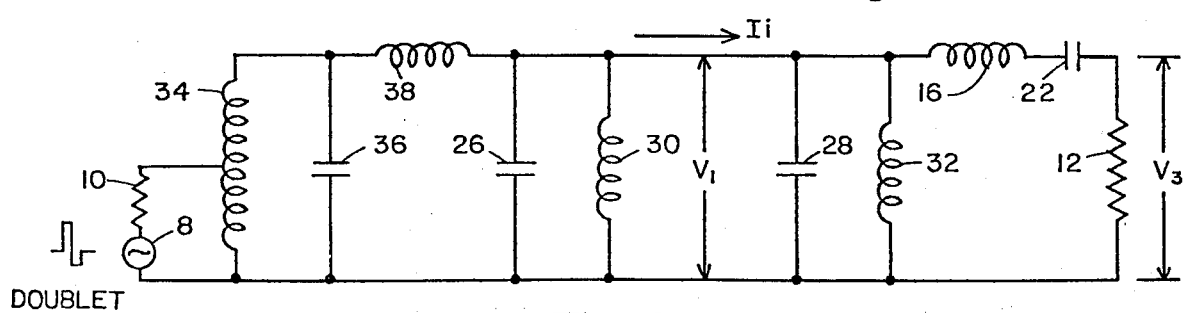
FIG. 6 is a schematic diagram of the circuit of FIG. 4 wherein a series resonant circuit is replaced by an inductively coupled parallel resonant circuit.

It is clear to those skilled in the art that with a small percentage bandwidth network, any series resonant circuit can be replaced by an inductively or capacitively coupled parallel resonator, and any parallel resonant circuit can be replaced by a capacitively or inductively coupled series resonant circuit. When this is done, a 90° RF phase shift is introduced at the filter mid frequency (fo) and in addition the resulting network supplies a much more nearly sinusoidal transient during the first RF half period. Referring to FIG. 6 and FIG. 4, the series resonant circuit comprising capacitor 20 and inductor 14 is replaced in FIG. 6 by an inductively coupled parallel resonant circuit comprising inductor 34, capacitor 36 and transforming inductor 38.

The RF phase change characteristics of the circuit shown in FIG. 6 when it is driven by the changing generalized doublet impulse are shown in Table II taken in conjunction with FIG. 7. The column labelled "Change in μs When RF Cycles Occur at a 100 KHz RATE" is a tabulation of the change in μs as measured at the zero crossing of a period of the RF cycles with changes of pulse amplitudes of the doublet impulse.

An examination of Table I shows that for the 0° phase shift at fo network in the region of 0° ECD (say from 0° to ±54°, and in the region of ±180° ECD (say from 126° to 180°, and from −126° to −180°), the two halves of the doublet impulse must have almost equal areas, and the resulting ECD will be very sensitive to the accuracy and stability of this adjustment. Additionally, Table II, having a reference point at 0° RF phase change, shows that the sensitive regions for a 90° phase shift at fo network are from +54° to +126° and from −54° to −126°. From these observations, it should be clear that a very stable and easy to adjust system would make use of both networks, i.e. that shown in FIG. 4 and FIG. 6. The system would switch between the two circuits in accordance with Table III in order to avoid the problems caused by oversensitivity.

TABLE II

| RF Phase Change (Degrees) | Change in μs When RF Cycles Occur at a 100 KHz RATE | First Pulse (Volts) | Second Pulse (Volts) |
|---|---|---|---|
| +180 | +5 | −4.0 | 0 |

TABLE II-continued

| RF Phase Change (Degrees) | Change in μs When RF Cycles Occur at a 100 KHz RATE | First Pulse (Volts) | Second Pulse (Volts) | |
|---|---|---|---|---|
| +144 | +4 | −4.0 | +3.0 | |
| +126 | +3.5 | −4.0 | +3.3 | |
| +108 | +3 | −4.0 | +3.6 | |
| +90 | +2.5 | −4.0 | +4.0 | |
| +72 | +2 | −3.9 | +4.0 | |
| +54 | +1.5 | −3.7 | +4.0 | |
| +36 | +1 | −3.4 | +4.0 | |
| +18 | +0.5 | −2.5 | +4.0 | |
| 0 | 0 | 0 | +4.0 | Reference Point |
| 0 | 0 | +4.0 | 0 | |
| −18 | −0.5 | +4.0 | −2.5 | |
| −36 | −1 | +4.0 | −3.4 | |
| −54 | −1.5 | +4.0 | −3.7 | |
| −72 | −2 | +4.0 | −3.9 | |
| −90 | −2.5 | +4.0 | −4.0 | |
| −108 | −3 | +3.6 | −4.0 | |
| −126 | −3.5 | +3.3 | −4.0 | |
| −144 | −4. | +3.0 | −4.0 | |
| −180 | −5 | 0 | −4.0 | |

TABLE III

| ECD (degrees) | Network |
|---|---|
| +180 | |
| | Figure 6 |
| +126 | |
| +126 | |
| | Figure 4 |
| +54 | |
| +54 | |
| | Figure 6 |
| −54 | |
| −54 | |
| | Figure 4 |
| −126 | |
| −126 | |
| | Figure 6 |
| −180 | |

Figure 8:
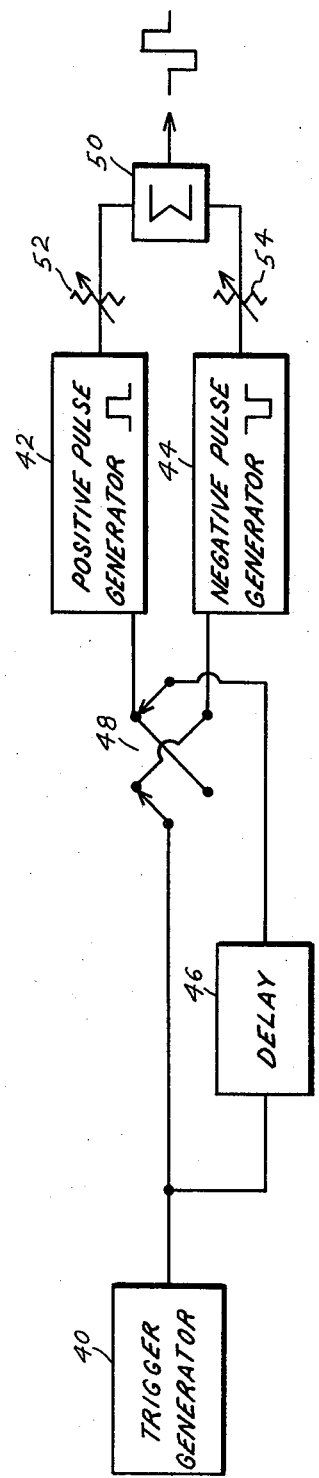
FIG. 8 is a block diagram of an apparatus producing the required doublet impulse signal.

FIG. 8 is a block diagram of an apparatus capable of producing the required doublet impulse. A trigger generator 40 generates a trigger which is applied to a positive pulse generator 42 and a negative pulse generator 44 in one case, however after a suitable delay in delay means 46. The delay may be switched into the circuit by suitably positioning switch 48 either before positive pulse generator 42 or negative pulse generator 44 depending on which pulse is to occur first. In the switch position shown, it is the positive pulse which is delayed as shown at the output of summer 50.

After the positive and negative pulses have been generated in generators 42 and 44, they may be applied to variable resistors 52 and 54 in order to vary the amplitudes of the pulses. Alternatively, pulse stretchers could be employed to vary the widths of the pulses. The outputs are then combined in summer 50 to produce the desired doublet impulse.

While we have described above the principles of our invention in connection with specific apparatus it is to be clearly understood that this description is made only by way of example and not as a limitation to the scope of our invention as set forth in the objects thereof and in the accompanying claims.

What is claimed is:

1. A method of varying the phase of RF cycles inside a pulse envelope while maintaining said pulse envelope stationary, said pulse envelope being the pulse shape obtained by connecting peaks of said RF cycles with an imaginary line, said RF cycles being generated by a reference network which produces a pulse envelope of a predetermined shape comprising the steps of:
   impulsing said network with a doublet impulse, said doublet impulse comprising first and second adjacent pulses of opposite polarity; and
   varying the area under at least one of said first and second pulses to vary the phase relationship of said RF cycles within said pulse envelope while maintaining said pulse envelope stationary.

2. A method according to claim 1, wherein the area is varied by varying the amplitude of said at least one pulse.

3. A method according to claim 1, wherein said network is a zero phase shift at fo network and wherein said first pulse is negative and said phase is varied from 0° to −90° by reducing the area of said first pulse.

4. A method according to claim 3, wherein said phase is varied from 0° to +90° by reducing the area of said second pulse.

5. A method according to claim 1, wherein said first network is a zero phase shift at fo network and wherein said first pulse is positive and said phase is varied from +180° to +90° by reducing the area of said first pulse.

6. A method according to claim 5, wherein said phase is varied from −180° to −90° by reducing the area of said second pulse.

7. A method according to claim 1, wherein said network is at 90° phase shift at fo network and wherein said first pulse is positive and said phase is varied from −90° to −180° by reducing the area of said first pulse.

8. A method according to claim 7, wherein said phase is varied from −90° to 0° by reducing the area of said second pulse.

9. A method according to claim 1, wherein said network is a 90° phase shift at fo network and wherein said first pulse is negative and said phase is varied from +90° to +180° by reducing the area of said second pulse.

10. A method according to claim 8, wherein said phase is varied from +90° to 0° by reducing the area of said first pulse.

* * * * *